United States Patent
Moriya et al.

(10) Patent No.: US 11,776,837 B2
(45) Date of Patent: Oct. 3, 2023

(54) ADHESIVE AGENT COMPOSITION, LAYERED PRODUCT AND PRODUCTION METHOD FOR LAYERED PRODUCT, AND METHOD FOR REDUCING THICKNESS OF SEMICONDUCTOR FORMING SUBSTRATE

(71) Applicant: NISSAN CHEMICAL CORPORATION, Tokyo (JP)

(72) Inventors: Shunsuke Moriya, Toyama (JP); Kazuhiro Sawada, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 116 days.

(21) Appl. No.: 17/297,174

(22) PCT Filed: Nov. 26, 2019

(86) PCT No.: PCT/JP2019/046201
§ 371 (c)(1),
(2) Date: May 26, 2021

(87) PCT Pub. No.: WO2020/111069
PCT Pub. Date: Jun. 4, 2020

(65) Prior Publication Data
US 2022/0025236 A1 Jan. 27, 2022

(30) Foreign Application Priority Data
Nov. 28, 2018 (JP) .................................. 2018-222885

(51) Int. Cl.
*H01L 21/683* (2006.01)
*C09J 183/04* (2006.01)
*B32B 37/12* (2006.01)
*C09J 7/40* (2018.01)
*B05D 3/02* (2006.01)

(52) U.S. Cl.
CPC .......... *H01L 21/6835* (2013.01); *B32B 37/12* (2013.01); *C09J 7/401* (2018.01); *C09J 183/04* (2013.01); *H01L 21/6836* (2013.01); *B05D 3/02* (2013.01); *C09J 2203/326* (2013.01)

(58) Field of Classification Search
CPC ..................................................... C09J 183/04
See application file for complete search history.

(56) References Cited

U.S. PATENT DOCUMENTS

| 2006/0166464 A1 | 7/2006 | Jakob et al. |
| 2010/0043608 A1 | 2/2010 | Jakob |
| 2011/0272092 A1 | 11/2011 | Richter |
| 2012/0028438 A1 | 2/2012 | Richter |
| 2013/0220687 A1 | 8/2013 | Tagami et al. |
| 2014/0150972 A1* | 6/2014 | Koellnberger ...... H01L 21/6835 156/325 |
| 2016/0189998 A1 | 6/2016 | Yasuda et al. |
| 2017/0110360 A1 | 4/2017 | Tagami et al. |
| 2017/0200628 A1 | 7/2017 | Kamibayashi et al. |
| 2019/0164802 A1 | 5/2019 | Ogino et al. |
| 2020/0109325 A1 | 4/2020 | Sawada et al. |
| 2021/0130666 A1* | 5/2021 | Sawada ............... H01L 21/6835 |
| 2022/0002602 A1* | 1/2022 | Sawada ................. B32B 43/006 |

FOREIGN PATENT DOCUMENTS

| DE | 2012 104363 A1 * | 11/2013 |
| JP | H06-329917 | 11/1994 |
| JP | 2006-508540 | 3/2006 |
| JP | 2009-528688 | 8/2009 |
| JP | 2012-510715 | 5/2012 |
| JP | 2012-513684 | 6/2012 |
| JP | 2013-179135 | 9/2013 |
| JP | 2013-232459 | 11/2013 |
| JP | 2014-525953 | 10/2014 |
| JP | 2016-119438 | 6/2016 |
| JP | 2017-079245 | 4/2017 |
| JP | 2017-132036 | 8/2017 |
| JP | 2018-046095 | 3/2018 |
| WO | 2015/190438 | 12/2015 |
| WO | 2017/221772 | 12/2017 |
| WO | WO 2018/051158 A1 * | 3/2018 |
| WO | 2018/216732 A1 | 11/2018 |
| WO | WO 2019/045336 A1 * | 3/2019 |
| WO | 2019/212008 A1 | 11/2019 |
| WO | WO 2019/212008 * | 11/2019 |
| WO | WO 2020/100966 * | 5/2020 |

OTHER PUBLICATIONS

EESR issued in EP Patent Application No. 19891103.4, Jul. 22, 2022.
ISR issued in WIPO Patent Application No. PCT/JP2019/046201, Feb. 25, 2020, English translation.
IPRP/WO issued in WIPO Patent Application No. PCT/JP2019/046201, May 25, 2021, English translation.

* cited by examiner

Primary Examiner — Marc S Zimmer
(74) Attorney, Agent, or Firm — GREENBLUM & BERNSTEIN, P.L.C.

(57) ABSTRACT

An adhesive composition for forming an adhesive layer that can bond a first substrate formed of a semiconductor-forming substrate to a second substrate formed of a support substrate in a peelable manner, the composition containing a component (A) which is cured through hydrosilylation and a peeling component (B) which contains a component containing an epoxy-modified polyorganosiloxane, wherein the component (A) contains a polysiloxane (A1) including a siloxane unit represented by $SiO_2$ (unit Q) and the like, and a platinum group metal catalyst (A2); and the polysiloxane (A1) contains a polyorganosiloxane (a1) including a siloxane unit represented by $SiO_2$ (unit Q') and the like, and a polyorganosiloxane (a2) including a siloxane unit represented by $SiO_2$ (unit Q") and the like, and having a functional group (Si—H) content of 5.0 mol/kg or greater.

4 Claims, No Drawings

ADHESIVE AGENT COMPOSITION, LAYERED PRODUCT AND PRODUCTION METHOD FOR LAYERED PRODUCT, AND METHOD FOR REDUCING THICKNESS OF SEMICONDUCTOR FORMING SUBSTRATE

TECHNICAL FIELD

The present invention relates to an adhesive composition, to a laminate, to a method for producing the laminate (hereinafter may be referred to as a "laminate production method"), and to a method for thinning a semiconductor-forming substrate (i.e., for reducing the thickness of the substrate).

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked by the mediation of through silicon vias (TSVs). In integration of multiple layers, each component wafer to be stacked is thinned by polishing a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine. Since the fixation must be removed after polishing, the fixation is called temporary bonding.

When the temporary bonding is removed by excessive force, in some cases a thinned semiconductor wafer may be broken or deformed. In order to prevent such a phenomenon, the temporarily bonded support must be detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing.

For example, one required performance includes having high stress (i.e., strong adhesion) within the plane during polishing and low stress (i.e., weak adhesion) toward the thickness direction during detaching.

Under such circumstances, temporary bonding must be performed with high stress (i.e., strong adhesion) within the plane during polishing and low stress (i.e., weak adhesion) toward the thickness direction during detaching. There have been reported several methods in relation to temporary bonding, including a method including forming a release layer through plasma polymerization of dimethylsiloxane and mechanically removing the release layer from an adhesive layer after polishing (see, for example, Patent Documents 1 and 2), and a method including fixing a semiconductor wafer to a support substrate by use of an adhesive composition, polishing the back surface of the semiconductor wafer, and removing the adhesive with an etchant (see, for example, Patent Document 3). As an embodiment of fixing a semiconductor wafer to a support by the mediation of an adhesive layer or the like, there has been reported a wafer processed body having a polymer layer formed by polymerizing an alkenyl group-containing organopolysiloxane and a hydrosilyl group-containing organopolysiloxane in the presence of a platinum catalyst in combination with a polymer layer formed of a thermosetting polysiloxane (see, for example, Patent Documents 4 to 6). Further, a composition containing a long chain α-acetylene alcohol and a curable silicone is reported as a hydrosilylation inhibitor (see, for example, Patent Document 7). However, recently, under rapid development in the semiconductor field, there is continuously strong demand for renewal and improvement of techniques, particularly those in relation to temporary bonding.

PRIOR ART DOCUMENTS

Patent Documents

Patent Document 1: Japanese Patent Application (kohyo) Publication No. 2012-510715

Patent Document 2: Japanese Patent Application (kohyo) Publication No. 2012-513684

Patent Document 3: Japanese Patent Application Laid-Open (kokai) No. 2013-179135

Patent Document 4: Japanese Patent Application Laid-Open (kokai) No. 2013-232459

Patent Document 5: Japanese Patent Application Laid-Open (kokai) No. 2006-508540

Patent Document 6: Japanese Patent Application Laid-Open (kokai) No. 2009-528688

Patent Document 7: Japanese Patent Application Laid-Open (kokai) No. 1994-329917

SUMMARY OF THE INVENTION

Problems to be Solved by the Invention

Thus, an object of the present invention is to provide an adhesive composition for forming an adhesive layer which has excellent heat resistance during joining to a support (i.e., curing), processing of the back surface of a wafer, and a part-mounting process and which can be easily peeled off during debonding of the support. Another object is to provide a laminate produced by use of the adhesive composition and a method for producing the laminate. Still another object is to provide a method for thinning a semiconductor-forming substrate.

Means for Solving the Problems

The present inventors have carried out extensive studies for attaining the aforementioned objects and have found that an adhesive layer which has remarkably excellent heat resistance and which can be easily peeled off during debonding of a support substrate can be formed by use of an adhesive composition for forming an adhesive layer that can bond a first substrate formed of a semiconductor-forming substrate to a second substrate formed of a support substrate in a peelable manner, the composition comprising a component which is cured through hydrosilylation and which contains a specific polysiloxane and a platinum group metal catalyst and a peeling component which contains a component containing an epoxy-modified polyorganosiloxane, wherein the specific polysiloxane contains an SiH group-containing polyorganosiloxane having a functional group (Si—H) content of 5.0 mol/kg or greater. The present invention has been accomplished on the basis of this finding.

Accordingly, the present invention provides the following.

1. An adhesive composition for forming an adhesive layer that can bond a first substrate formed of a semiconductor-forming substrate to a second substrate formed of a support substrate in a peelable manner, the composition comprising a component (A) which is cured through hydrosilylation and a peeling component (B) which contains a component containing an epoxy-modified polyorganosiloxane, wherein the component (A) comprises a polysiloxane (A1) having one or more units selected from the group consisting of a siloxane unit represented by $SiO_2$ (unit Q), a siloxane unit represented by $R^1R^2R_3SiO_{1/2}$ (unit M), a siloxane unit represented by $R^4R^5SiO_{2/2}$ (unit D), and a siloxane unit represented by $R^6SiO_{3/2}$ (unit T) (wherein each of $R^1$ to $R^6$ is a group or an atom bonded to a silicon atom and represents an alkyl group, an alkenyl group, or a hydrogen atom) and a platinum group metal catalyst (A2); and the polysiloxane (A1) comprises a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T' (wherein each of $R^{1'}$ to $R^{6'}$ is a group bonded to a silicon atom and represents an alkyl group or an alkenyl group, and at least one of $R^{1'}$ to $R^{6'}$ is an alkenyl group), and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T'', and having a functional group (Si—H) content of 5.0 mol/kg or greater (wherein each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom).

2. An adhesive composition according to 1, wherein the epoxy-modified polyorganosiloxane has an epoxy value of 0.1 to 5.

3. A laminate comprising a first substrate formed of a semiconductor-forming substrate, a second substrate formed of a support substrate, and an adhesive layer which is provided between the first substrate and the second substrate and which bonds the two substrates in a peelable manner, wherein the adhesive layer is a cured film formed by use of an adhesive composition as recited in 1 or 2.

4. A laminate production method comprising a step of applying an adhesive composition as recited in 1 or 2 onto a first substrate formed of a semiconductor-forming substrate or a second substrate formed of a support substrate, to thereby form an adhesive coating layer, and a step of adhering the first substrate to the second substrate by the mediation of the adhesive coating layer; applying a load to the first substrate and the second substrate in a thickness direction, to thereby closely bind the first substrate, the adhesive coating layer, and the second substrate, while at least one of a heat treatment and a reduced pressure treatment is performed; and then performing a post-heat treatment.

5. A method for thinning a semiconductor-forming substrate, the method comprising a step of applying an adhesive composition as recited in 1 or 2 onto a first substrate formed of a semiconductor-forming substrate or a second substrate formed of a support substrate, to thereby form an adhesive coating layer, a step of adhering the first substrate to the second substrate by the mediation of the adhesive coating layer; applying a load to the first substrate and the second substrate in a thickness direction, to thereby closely bind the first substrate, the adhesive coating layer, and the second substrate, while at least one of a heat treatment and a reduced pressure treatment is performed; and then performing a post-heat treatment, to thereby form a laminate, and a step of performing a thinning treatment on the first substrate of the laminate.

Effects of the Invention

The adhesive layer produced from the adhesive composition of the present invention provides suitable adhesion between a support and a workpiece during processing of the workpiece such as a wafer, and can be easily removed after completion of the processing. Thus, use of the adhesive composition of the present invention can provide an adhesive layer which can be peeled off without applying an excessive load for debonding a support or a workpiece such as a wafer. In addition, by virtue of excellent heat resistance, the adhesive layer produced from the adhesive composition of the present invention satisfactorily withstands heat (high temperature) which is applied in steps of a semiconductor process such as thinning of a wafer or a TSV process. The adhesive composition of the present invention, having such advantageous characteristics, is sufficiently adapted to recent progress in the field of semiconductors.

MODES FOR CARRYING OUT THE INVENTION

The adhesive composition of the present invention is used for bonding the circuit face of a wafer to a support in such a manner that the support and the wafer can be peeled from each other, while the backside of the wafer is processed. The adhesive composition contains a component (A) which is cured through hydrosilylation and a peeling component (B) which contains a component containing an epoxy-modified polyorganosiloxane, wherein the component (A) comprises a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T) and a platinum group metal catalyst (A2); and the polysiloxane (A1) comprises a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M", unit D", and unit T", and having a functional group (Si—H) content of 5.0 mol/kg or greater.

Since the adhesive layer produced from the adhesive composition of the present invention can suitably bond the circuit face of a wafer to a support in such a manner that the support and the wafer can be peeled from each other, the backside surface (i.e., the surface opposite the circuit face) of the wafer can be processed (e.g., polished), to thereby reduce the thickness of the wafer or perform other process to the wafer. After completion of processing, the thinned or processed wafer can be readily detached from the support by peeling off the adhesive layer.

As used herein, the expression "can be debonded" or "peelable" refers to a state of lower bonding strength. In other words, it means excellent peelability for ensuring easy debonding.

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic. No particular limitation is imposed on the number of carbon atoms thereof, and the number of carbon atoms is preferably 40 or less, more preferably 30 or less, still more preferably 20 or less, yet more preferably 10 or less.

Specific examples of the linear-chain or branched chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cyclic alkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethylcyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain, branched-chain, or cyclic. No particular limitation is imposed on the number of carbon atoms thereof, and the number of carbon atoms is preferably 40 or less, more preferably 30 or less, still more preferably 20 or less, yet more preferably 10 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl. Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2). Thus, the curing mechanism differs from the mechanism of curing mediated by, for example, silanol groups. Therefore, neither of the siloxanes employed in the present invention is required to have a silanol group or a functional group forming a silanol group through hydrolysis (e.g., an alkyloxy group).

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T". Two or more polyorganosiloxanes satisfying the above conditions may be used in combination as the polyorganosiloxane (a2).

Examples of preferred combinations of two or more units selected from the group consisting of unit Q", unit M", unit D", and unit T" include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The functional group (Si—H) content of the polyorganosiloxane (a2) used in the present invention is 5.0 mol/kg or greater, preferably 5.5 mol/kg or greater, more preferably 6.0 mol/kg or greater, still more preferably 6.5 mol/kg or greater, yet more preferably 7.0 mol/kg or greater. By use of the polyorganosiloxane (a2) satisfying the above conditions, an adhesive composition which provides excellent peelability and which forms an adhesive layer having remarkably excellent heat resistance can be produced at high reproducibility.

Notably, the functional group (Si—H) content may be calculated through, for example, $^1$H-NMR, based on the protons of the functional groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) are generally 500 to 1,000,000, preferably 5,000 to 50,000.

In the present invention, weight average molecular weight may be determined by means of, for example, a GPC apparatus (EcoSEC, HLC-8320GPC, products of Tosoh Corporation) and GPC columns (Shodex (registered trademark), KF-803L, KF-802, and KF-801, products of Showa Denko K.K.) at a column temperature of 40° C. and a flow rate of 1.0 mL/min by use of tetrahydrofuran as an eluent (extraction solvent) and polystyrene (product of Sigma-Aldrich) as a standard substance.

The component (A) contains the platinum group metal catalyst (A2). The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

In order to suppress the progress of hydrosilylation, the component (A) may contain a polymerization inhibitor (A3). By incorporating a polymerization inhibitor into the adhesive composition of the present invention, thermal curing for bonding can be suitably controlled, whereby a composition which provides an adhesive layer exhibiting excellent bonding and debonding performance can be produced at high reproducibility.

No particular limitation is imposed on the polymerization inhibitor, so long as it can suppress the progress of hydrosilylation. Specific examples of the polymerization inhibitor include, but are not limited to, alkynylalkyl alcohols such as 1-ethynyl-1-cyclohexanol and 1,1-diphenyl-2-propione-1-ol.

Generally, the amount of polymerization inhibitor with respect to the polyorganosiloxane (a1) and the polyorganosiloxane (a2) is 1000.0 ppm or more from the viewpoint of attaining the effect, and 10000.0 ppm or less from the viewpoint of preventing excessive suppression of hydrosilylation.

The peeling component (B) used in the present invention contains a component containing an epoxy-modified polyorganosiloxane.

Examples of the epoxy-modified polyorganosiloxane include a siloxane containing a siloxane unit represented by $R^{11}R^{12}SiO_{2/2}$ (unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

The epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific example of the organic group containing an epoxy group include, but are not limited to, 3-glycidoxypropyl and 2-(3,4-epoxycyclohexyl)ethyl.

In the present invention, examples of preferred epoxy-modified polyorganosiloxanes include, but are not limited to, epoxy-modified polydimethylsiloxane.

The epoxy-modified polyorganosiloxane contains the aforementioned siloxane unit (unit $D^{10}$), but may also contain the aforementioned unit Q, unit M and/or unit T, in addition to unit $D^{10}$.

In one preferred embodiment of the present invention, specific examples of the epoxy-modified polyorganosiloxane include polyorganosiloxane formed only of unit D, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-modified polyorganosiloxane is preferably an epoxy-modified polyorganodimethylsiloxane having an epoxy value of 0.1 to 5. The weight average molecular weight thereof is generally 1,500 to 500,000, but preferably 100,000 or lower, for the purpose of suppression of deposition in the composition.

Notably, the epoxy value of the present invention may be determined by, for example, mixing an epoxy-modified polyorganosiloxane (i.e., a target epoxy compound) (0.5 mg) with a solution for measurement (diisobutyl ketone:acetic acid:tetraethylammonium bromide=1,000:1,000:140 (v/v/v)) (50 g), stirring the mixture for 30 minutes to prepare a solution, and titrating the thus-prepared solution with 0.1-mol/L perchloric acid-acetic acid solution by means of an auto titrator GT-100 (product of Mitsubishi Chemical Co., Ltd., current Mitsubishi Chemical Analytech Co., Ltd.).

Specific examples of the epoxy-modified polyorganosiloxane include, but are not limited to, ECMS-227 (product of Gelest Inc., weight average molecular weight: 27,000) represented by formula (B-1), ECMS-327 (product of Gelest Inc., weight average molecular weight: 28,800) represented by formula (B-2), KF-101 (product of Shin-Etsu Chemical Co., Ltd., weight average molecular weight: 31,800) represented by formula (B-3), KF-1001 (product of Shin-Etsu Chemical Co., Ltd., weight average molecular weight: 55,600) represented by formula (B-4), KF-1005 (product of Shin-Etsu Chemical Co., Ltd., weight average molecular weight: 11,500) represented by formula (B-5), X-22-343 (product of Shin-Etsu Chemical Co., Ltd., weight average molecular weight: 2,400) represented by formula (B-6), BY16-839 (product of Dow Corning, weight average molecular weight: 51,700) represented by formula (B-7), and ECMS-327 (product of Gelest Inc., weight average molecular weight: 28,800) represented by formula (B-8).

[F1]

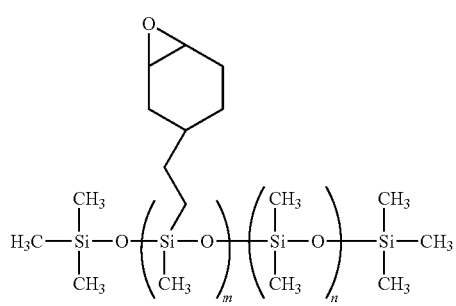

(Each of m and n represents the number of repeating units.)

[F2]

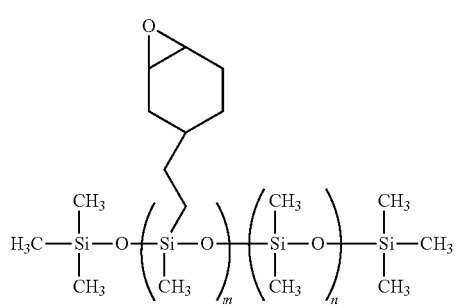

(Each of m and n represents the number of repeating units.)

[F3]

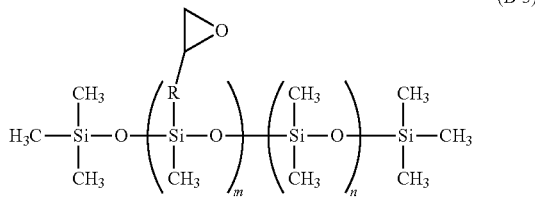

(Each of m and n represents the number of repeating units. R represents a C1 to C10 alkylene group.)

[F4]

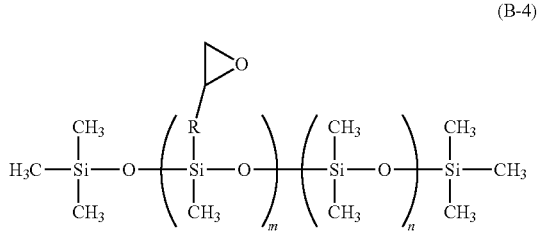

(Each of m and n represents the number of repeating units. R represents a C1 to C10 alkylene group.)

[F5]

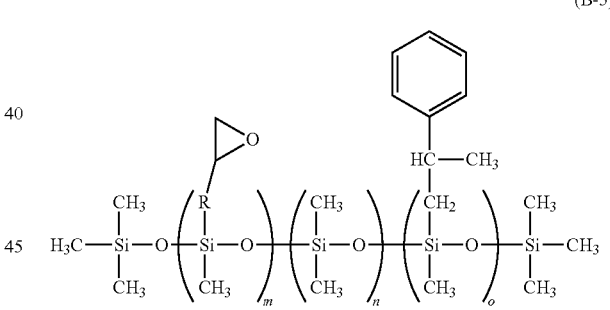

(Each of m, n and o represents the number of repeating units. R represents a C1 to C10 alkylene group.)

[F6]

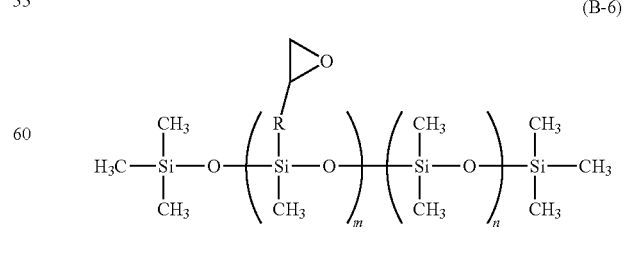

(Each of m and n represents the number of repeating units. R represents a C1 to C10 alkylene group.)

[F7]

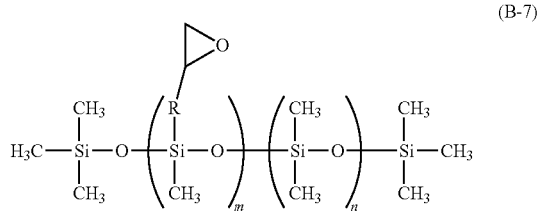

(B-7)

(Each of m and n represents the number of repeating units. R represents a C1 to C10 alkylene group.)

[F8]

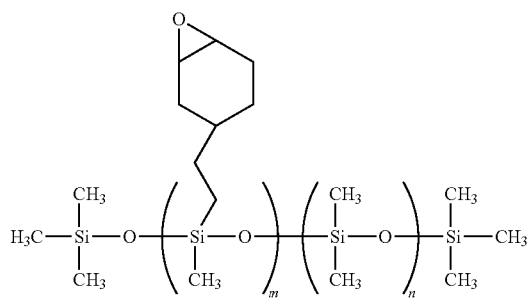

(B-8)

So long as the effects of the present invention are not impaired, the adhesive composition of the present invention may further contain, in addition to the component containing the epoxy-modified polyorganosiloxane, a component containing a polyorganosiloxane which provides peelability, such as a methyl group-containing polyorganosiloxane or a phenyl group-containing polyorganosiloxane.

The adhesive composition of the present invention contains the components (A) and (B) at any compositional ratio. In consideration of the balance between bonding performance and debonding performance, the compositional ratio (mass %) of component (A) to component (B) is preferably 99.995:0.005 to 30:70, more preferably 99.9:0.1 to 75:25.

For the purpose of adjusting the viscosity or for other reasons, the adhesive composition of the present invention may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition of the present invention contains a solvent, the solvent content is appropriately adjusted in consideration of a target viscosity of the composition, the application method to be employed, the thickness of the formed thin film, etc. The solvent content of the entire composition is about 10 to about 90 mass %.

The adhesive composition of the present invention generally has a viscosity (25° C.) of 1,000 to 20,000 mPa·s, preferably 1,000 to 5,000 mPa·s. The viscosity of the adhesive composition of the present invention may be controlled by modifying the type and formulation of the organic solvent used, the film-forming component concentration, etc., in consideration of various factors such as the coating method employed and the target film thickness.

The adhesive composition of the present invention may be produced by mixing film-forming components with solvent. However, in the case where no solvent is used, the adhesive composition of the present invention for use in light irradiation debonding may be produced by mixing film-forming components.

No particular limitation is imposed on the sequential order of mixing, so long as the adhesive composition of the present invention can be easily produced at high reproducibility. One possible example of the production method includes dissolving all film-forming components in a solvent. Another possible example of the production method includes dissolving a part of film-forming components in a solvent, dissolving the other film-forming components in another solvent, and mixing the thus-obtained two solutions. In this case, if required, a part of the solvent or a film-forming component having high dissolvability may be added in a final stage. Furthermore, so long as the relevant components are not decomposed or denatured in preparation of the composition, the mixture may be appropriately heated.

In the present invention, in order to remove foreign substances present in the composition, the adhesive composition may be filtered through a sub-micrometer filter or the like in the course of production of the composition or after mixing all the components.

The laminate of the present invention has a first substrate formed of a semiconductor-forming substrate, a second substrate formed of a support substrate, and an adhesive layer which is provided between the first substrate and the second substrate and which bonds the two substrates in a peelable manner, wherein the adhesive layer is a cured film formed by use of the aforementioned adhesive composition. Thus, no particular limitation is imposed on the configuration of the laminate, so long as the laminate has an adhesive layer which is provided between the two substrates and which bonds the two substrates in a peelable manner. For example, an arbitral functional layer may be disposed between a substrate and the adhesive layer for the purpose of further reducing the load to the substrates during debonding or for other reasons. In this case, the functional layer may be appropriately selected, so long as the effects of the present invention are not impaired.

The adhesive layer of the laminate of the present invention generally has a cross-linking density of 0.50 mol/kg or greater, preferably 0.60 mol/kg or greater, more preferably 0.70 mol/kg or greater, still more preferably 0.80 mol/kg or greater, yet more preferably 0.90 mol/kg or greater. Notably, in the present invention, the cross-linking density can be calculated by the following equation: (cross-linking density) =[A]×[B]/[C] ([A]: the functional group (Si—H) content (mol/kg) of polyorganosiloxane (a2); [B]: the amount (kg) of added polyorganosiloxane (a2); and [C]: the total weight (kg) of the adhesive composition excepting solvent.

One preferred embodiment of the laminate of the present invention includes a first substrate formed of a semiconductor-forming substrate, a second substrate formed of a support substrate, and an adhesive layer which is a cured film formed by use of the aforementioned adhesive composition. The adhesive layer is provided between the first substrate and the second substrate so as to be in contact with the two substrates.

One preferred embodiment of the laminate production method of the present invention includes a step of applying the aforementioned adhesive composition onto a first substrate or a second substrate, to thereby form an adhesive coating layer, and a step of adhering the first substrate to the second substrate by the mediation of the adhesive coating layer; applying a load to the first substrate and the second substrate in a thickness direction, to thereby closely bind the first substrate, the adhesive coating layer, and the second substrate, while at least one of a heat treatment and a reduced pressure treatment is performed; and then performing a post-heat treatment. Through the post-heat treatment in the latter step, the adhesive coating layer is suitably cured in a final stage, to thereby provide an adhesive layer.

In one embodiment, the first substrate is a wafer, and the second substrate is a support. The adhesive composition may be applied to either of the first or second substrate, or both of the first and second substrates. Among two substrates, the first substrate is preferred.

No particular limitation is imposed on the wafer, and an example of the wafer is a silicon wafer or a glass wafer having a diameter of about 300 mm and a thickness of about 770 μm.

No particular limitation is imposed on the support (carrier), and an example of the support is a silicon wafer having a diameter of about 300 mm and a thickness of about 700 μm.

In the case where laser irradiation is employed for debonding the first substrate from the second substrate, a substrate which allows passage of laser light is used as the second substrate. In this case, the transmittance to laser light is generally 80% or higher, preferably 90% or higher. No particular limitation is imposed on the second substrate, and a specific example of the substrate is a silicon wafer having a diameter of about 300 mm and a thickness of about 700 μm.

The laser light is laser light employed in the below-mentioned debonding (peeling) step. The wavelength of the laser light is generally 190 nm to 600 nm. From the viewpoints of suitably performing debonding at high reproducibility and the like, the wavelength is preferably 250 nm or longer, more preferably 300 nm or longer, and preferably 580 nm or shorter, more preferably 560 nm or shorter. Laser light having a wavelength of, for example, 308 nm, 355 nm, or 532 nm can suitably debond the laminate of the present invention.

The thickness of the adhesive coating layer is generally 5 to 500 μm. However, the thickness is preferably 10 μm or greater, more preferably 20 μm or greater, still more preferably 30 μm or greater, from the viewpoint of maintaining the film strength, and it is preferably 200 μm or less, more preferably 150 μm or less, still more preferably 120 μm or less, yet more preferably 70 μm or less, from the viewpoint of avoiding variation in uniformity of the film thickness.

No particular limitation is imposed on the application method, and spin coating is generally employed. In an alternative method, a coating film is formed through spin coating or a similar technique, and the sheet-form coating film is attached. The concepts of the application method and the coating film of the invention also encompasses the alternative method and coating film.

The heating temperature is generally 80° C. or higher. However, it is preferably 150° C. or lower, from the viewpoint of prevention of excessive curing. The time of heating is generally 30 seconds or longer, preferably 1 minute or longer, for securing temporary bonding performance. Also, the heating time is generally 10 minutes or shorter, preferably 5 minutes or shorter, from the viewpoint of suppressing deterioration of the adhesive layer and other members.

In the reduced pressure treatment, the two adhesive layer which are in contact with each other are placed in an atmosphere at 10 Pa to 10,000 Pa. The time of the reduced pressure treatment is generally 1 to 30 minutes.

In one preferred embodiment of the present invention, the two adhesive layers which are in contact with each other are bonded together preferably through a reduced pressure treatment, more preferably through a heating treatment in combination with a reduced pressure treatment.

No particular limitation is imposed on the load which is applied to the first substrate and the second substrate in a thickness direction, so long as the first substrate, the second substrate, and the layer therebetween are not damaged, and these elements are closely adhered. The load is generally 10 to 1,000 N.

The temperature of post-heating is preferably 120° C. or higher from the viewpoint of attaining sufficient curing rate, and preferably 260° C. or lower from the viewpoint of preventing deterioration of the substrates and the adhesive. The heating time is generally 1 minute or longer from the viewpoint of achieving suitable joining of a wafer through curing, preferably 5 minutes or longer from the viewpoint of stability in physical properties of the adhesives. Also, the heating time is generally 180 minutes or shorter, preferably 120 minutes or shorter, from the viewpoint of avoiding, for example, an adverse effect on the adhesive layers due to excessive heating. Heating may be performed by means of a hot plate, an oven, or the like. Notably, a purpose of performing post-heating is to more suitably cure, for example, the adhesive composition containing the component (A) which is cured through hydrosilylation.

An example of the processing applied to the laminate of the present invention is a processing of a surface opposite the circuit-furnished surface of the first substrate formed of a semiconductor-forming substrate. Typically, the processing is a thinning of a wafer by polishing the backside thereof. By use of the thus-thinned wafer, silicon vias (TSVs) and the like are formed, and the thinned wafer is removed from the support. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is applied to the laminate bonded to the support. The adhesive layer included in the laminate of the present invention has heat resistance to the load.

In one specific embodiment, when the surface opposite the circuit-furnished surface of a wafer having a diameter of about 300 mm and a thickness of about 770 μm is polished, the thickness of the wafer can be reduced to about 80 μm to about 4 m.

No particular limitation is imposed on the mode of the laminate debonding method of the present invention, and examples of the mode include peeling with solvent, laser debonding, mechanical debonding by means of a machine with a sharp part, and peeling of a support from the wafer. Generally, the debonding operation is carried out after completion of production of the laminate of the present invention and a specific processing and the like.

In one example, the second substrate can be easily separated from the first substrate and the adhesive layer through application of specific force at the interface between the support substrate and the adhesive layer of the laminate of the present invention.

In another example, the second substrate can be removed by irradiating the laminate of the present invention with laser light from the second substrate which allows passage of the laser light. In the laminate of the present invention, the first substrate is temporarily bonded to the second substrate which allows passage of laser light by the mediation of the adhesive layer which absorbs lase light in a suitably peelable manner. Thus, when the adhesive layer receives the laser light irradiation from the second substrate side, the adhesive layer absorbs the laser light, to thereby cause decomposition of the surface of the layer. In this case, a gas is generated between the adhesive layer and the second substrate in such a volume that the substrate is not damaged by the gas. As a result, the bonding strength decreases, and the second substrate can be easily separated from the first substrate and the adhesive layer at the interface between the second substrate and the adhesive layer.

Notably, the entire area of the adhesive layer is not necessarily irradiated with laser light. Even when the first adhesive layer has both a laser light-irradiated area and a laser light-non-irradiated area, it is sufficient that the bonding strength of the entire adhesive layer is satisfactorily reduced. Under such conditions, the second substrate can be easily separated, through application of small external force (e.g., pulling), from the laminate at the interface between the adhesive layer and the second substrate. The ratio of the laser light-irradiated area to the laser light-non-irradiated area and the locational distribution of the two areas vary depending on the type and composition of the adhesive used, the thickness of the adhesive layer, the intensity of irradiation laser light, and other factors. However, those skilled in the art can set appropriate conditions, without carrying out excessive tests. For example, a laser light-non-irradiated area may be provided adjacent to a laser light-irradiated area with the same width as that of the laser light with which the adhesive layer is irradiated.

Thus, even when only a part of the adhesive layer is irradiated with laser light, the second substrate can be separated. As a result, the time for applying laser light to one laminate can be shortened, whereby the total time for debonding can be shortened.

When resin (the adhesive layer) remains on the surface of wafer, the resin can be removed through washing with a solvent (i.e., dissolving, lift-off), peeling with tape, etc. The present invention is directed to a laminate processing method including joining (bonding) through the aforementioned bonding method, polishing the backside of the wafer, and debonding through the aforementioned debonding method.

EXAMPLES

The present invention will next be described in detail by way of example, which should not be construed as limiting the invention thereto. The apparatuses employed in the present invention are as follows.
(1) NMR: NMR ECA500 (product of JEOL Ltd.)
(2) Agitator: AWATORI RENTAROU (product of Thinky Corporation)
(3) Thermogravimetric analysis (TGA): differential thermal balance TG-DTA 2020SR (product of NETZSCH)
(4) Bonding apparatus: XBS300 (product of Suess Microtec SE)
(5) Debonding apparatus: Manual Debonder (product of Suess Microtec SE)
(6) Ultrasonic microscope: CSAMD9600 (product of Sonoscan)
(7) Vaccum heating apparatus: VJ-300-S (product of Ayumi Industry Co., Ltd.)
(8) Backside grinder (thinning): Back grinder SS30 (product of Tokyo Seimitsu Co., Ltd.)

[1] Determination of Functional Group (Si—H) Content

Linear-chain polydimethylsiloxane having SiH groups (viscosity: 100 mPa·s) (products of WACKER Chemie AG) (0.02 g) was dissolved in a solvent for measurement (dimethyl sulfone:heavy chloroform=0.2:99.8) (1.0 g), to thereby prepare a measurement solution.

The thus-prepared solution was analyzed by means of an NMR (measurement conditions: $^1$HNMR, temperature of 25° C., and 32 scans), and the amount of functional groups (Si—H) was calculated from the obtained integrated intensity.

Also, the functional group (Si—H) contents of linear-chain polydimethylsiloxane having SiH groups (viscosity: 70 mPa·s) (products of WACKER Chemie AG) and linear-chain polydimethylsiloxane having SiH groups (viscosity: 30 mm/s) (products of WACKER Chemie AG) were calculated through the same procedure.

As a result, the functional group (Si—H) contents of linear-chain polydimethylsiloxane having SiH groups (viscosity: 100 mPa·s) (products of WACKER Chemie AG), linear-chain polydimethylsiloxane having SiH groups (viscosity: 70 mPa·s) (products of WACKER Chemie AG), and linear-chain polydimethylsiloxane having SiH groups (viscosity: 30 mm/s) (products of WACKER Chemie AG) were found to be 4.3 mol/kg, 7.4 mol/kg, and 13.1 mol/kg, respectively.

[2] Determination of Epoxy Value

The epoxy value of epoxy-modified polyorganosiloxane was determined through the following procedure. Table 1 shows the results. The epoxy value was determined by mixing an epoxy-modified polyorganosiloxane (i.e., epoxy compound) (0.5 mg) with a solution for measurement (di-isobutyl ketone acetic acid:tetraethylammonium bromide=1, 000:1,000:140 (v/v/v)) (50 g), stirring the mixture for 30 minutes to prepare a solution, and titrating the thus-prepared solution with 0.1-mol/L perchloric acid-acetic acid solution by means of an auto titrator GT-100 (product of Mitsubishi Chemical Co., Ltd., current Mitsubishi Chemical Analytech Co., Ltd.). Information including the structures of the analyzed epoxy compounds are the same described above.

TABLE 1

| Epoxy compound (tradename) | Epoxy value |
|---|---|
| ECMS-227 | 0.32 |
| ECMS-327 | 0.37 |
| KF-101 | 3.18 |
| KF-1001 | 0.28 |
| KF-1005 | 4.21 |
| X-22-343 | 1.97 |
| SF8411 | 0.22 |
| BY16-834 | 0.39 |

[3] Production of Adhesive

Referential Example 1

The following ingredients were agitated for 10 minutes by means of an agitator, to thereby prepare a mixture. The ingredients were a base polymer formed of an MQ resin having vinyl groups (products of WACKER Chemie AG) (50.0 g) serving as polysiloxane (a1), linear-chain polydimethylsiloxane having SiH groups (viscosity: 100 mPa·s, functional group (Si—H) content: 4.3 mol/kg) (products of WACKER Chemie AG) (7.84 g) serving as polysiloxane (a2), linear-chain polydimethylsiloxane having vinyl groups (viscosity: 200 mPa·s) (products of WACKER Chemie AG) (17.88 g) serving as polysiloxane (a1), 1-ethynyl-1-cyclohexanol (products of WACKER Chemie AG) (0.19 g) serving as a polymerization inhibitor (A3), 1,1-diphenyl-2-propione-1-ol (products of Tokyo Chemical Industry Co., Ltd.) (0.19 g) serving as a polymerization inhibitor (A3), p-menthane (product of FUJIFILM Wako Pure Chemical Corporation) (11.64 g) and decane (products of Tokyo Chemical Industry Co., Ltd.) (1.21 g) serving as solvents, and epoxy-modified polyorganosiloxane (X-22-343, product of Shin-Etsu Chemical Co., Ltd.) (0.76 g) serving as a peeling component (B).

To the thus-obtained mixture, there was added another mixture (0.46 g) prepared by agitating a platinum catalyst (products of WACKER Chemie AG) (0.15 g) serving as a platinum group metal catalyst (A2) and linear-chain polydimethylsiloxane having vinyl groups (viscosity: 1,000 mPa·s) (products of WACKER Chemie AG) (0.76 g) serving as polysiloxane (a1) by means of an agitator for 10 minutes. The resultant mixture was further agitated for 10 minutes, to thereby prepare a composition.

Example 1

The following ingredients were agitated for 10 minutes by means of an agitator, to thereby prepare a mixture. The ingredients were a base polymer formed of an MQ resin having vinyl groups (products of WACKER Chemie AG) (50.0 g) serving as polysiloxane (a1), linear-chain polydimethylsiloxane having SiH groups (viscosity: 70 mPa·s, functional group (Si—H) content: 7.4 mol/kg) (products of WACKER Chemie AG) (4.29 g) serving as polysiloxane (a2), linear-chain polydimethylsiloxane having SiH groups (viscosity: 30 mm/s, functional group (Si—H) content: 13.1 mol/kg) (products of WACKER Chemie AG) (2.68 g) serving as polysiloxane (a2), linear-chain polydimethylsiloxane having vinyl groups (viscosity: 200 mPa·s) (products of WACKER Chemie AG) (1.61 g) serving as polysiloxane (a1), 1-ethynyl-1-cyclohexanol (products of WACKER Chemie AG) (0.18 g) serving as a polymerization inhibitor (A3), 1,1-diphenyl-2-propione-1-ol (products of Tokyo Chemical Industry Co., Ltd.) (0.18 g) serving as a polymerization inhibitor (A3), p-menthane (products of Tokyo Chemical Industry Co., Ltd.) (10.93 g) and decane (product of FUJIFILM Wako Pure Chemical Corporation) (1.21 g) serving as solvents, and epoxy-modified polyorganosiloxane (X-22-343, product of Shin-Etsu Chemical Co., Ltd.) (0.71 g) serving as a peeling component (B).

To the thus-obtained mixture, there was added another mixture (12.9 g) prepared by agitating a platinum catalyst (products of WACKER Chemie AG) (0.09 g) serving as a platinum group metal catalyst (A2) and linear-chain polydimethylsiloxane having vinyl groups (viscosity: 1,000 mPa·s) (products of WACKER Chemie AG) (15.4 g) serving as polysiloxane (a1) by means of an agitator for 10 minutes. The resultant mixture was further agitated for 10 minutes, to thereby prepare a composition.

[4] Heat Resistance Test (TGA)

Referential Example 2 and Example 2

The thus-obtained compositions were analyzed in terms of heat resistance. Specifically, the solvent of each composition was removed, and the resultant solid (50.0 mg) was sampled. The temperature at which the weight of the sample was reduced by 1% was determined and calculated by means of a differential thermal balance. The range of the analysis temperature was room temperature to 400° C., and the temperature elevation rate was 10° C./minute.

As a result, the composition produced in Referential Example 1 was found to have a cross-linking density of 0.44 mol/kg and a 1% weight reduction temperature of 359.5° C., and the composition produced in Example 1 was found to have a cross-linking density of 0.92 mol/kg and a 1% weight reduction temperature of 391.0° C. These data have proven a high heat resistance of the composition of the present invention.

Notably, the cross-linking density was calculated by the following equation: (cross-linking density)=[A]×[B]/[C] ([A]: the functional group (Si—H) content (mol/kg) of linear-chain polydimethylsiloxane having SiH groups serving as polyorganosiloxane (a2); [B]: the amount of added linear-chain polydimethylsiloxane having SiH groups serving as polyorganosiloxane (a2); and [C]: the total weight (kg) of the adhesive composition excepting solvent.

[5] Production of Laminate and Peelability and Heat Resistance Tests

Example 3

The composition produced in Example 1 was applied onto a 300-mm silicon wafer (thickness: 770 μm) serving as a semiconductor-forming substrate through spin coating, to thereby form a thin film (adhesive coating layer) having a thickness of about 10 μm on the circuit side surface.

The silicon wafer serving as a semiconductor-forming substrate having a thin film and another 300-mm silicon wafer (thickness: 770 μm) serving as a support substrate were bonded together by means of a bonding machine such that the thin film was sandwiched by the two wafers. Subsequently, the bonded product was placed on a hot plate such that the silicon wafer serving as a semiconductor-forming substrate was in contact with the hot plate, and heated at 200° C. for 10 minutes (post heating), to thereby yield a laminate. Notably, bonding was carried out at 50° C. under a reduced pressure of 10 mBar with a load of 500 N.

Thereafter, in order to access peelability, the thus-obtained laminate was set in a debonding apparatus, and the force required for debonding was measured. Debonding was effected at the interface between the support substrate silicon wafer and the adhesive layer. As a result, debonding suitably occurred by peeling force of 15 N.

Also, in order to access heat resistance, a laminate produced through the same procedure as described above was heated by means of a vacuum heating apparatus (heating conditions: reduced pressure of 2.1 Torr, heating temperature of 350° C., and heating time of 30 minutes). The wafer surface of the heated laminate was observed under an ultrasonic microscope so as to check for defects such as voids. As a result, no such defects were observed, proving excellent heat resistance.

[6] Thinning Step

Example 4

A laminate produced through the same procedure as employed in Example 3 was set in a backside grinder, and thinning of the semiconductor-forming substrate silicon wafer was performed. As a result, the silicon wafer was smoothly thinned. Through observation under an optical microscope, no chipping was found at the edge of the thinned wafer.

The invention claimed is:

1. An adhesive composition for forming an adhesive layer that can bond a first substrate formed of a semiconductor-forming substrate to a second substrate formed of a support substrate in a peelable manner,
the composition comprising
a component (A) which is cured through hydrosilylation and
a peeling component (B) which contains a component containing an epoxy-modified polyorganosiloxane having an epoxy value of 0.1 to 5, wherein
the component (A) comprises
a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T) (wherein each of $R^1$ to $R^6$ is a group or an atom bonded to a silicon atom and represents an alkyl group, an alkenyl group, or a hydrogen atom) and
a platinum group metal catalyst (A2); and
the polysiloxane (A1) comprises:
a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T' (wherein each of $R^{1'}$ to $R^{6'}$ is a group bonded to a silicon atom and represents an alkyl group or an alkenyl group, and at least one of $R^{1'}$ to $R^{6'}$ is an alkenyl group), and
a polyorganosiloxane (a2) having one or more units selected from the group consisting of a siloxane unit represented by $SiO_2$ (unit Q"), a siloxane unit represented by $R^{1''}R^{2''}R^{3''}SiO_{1/2}$ (unit M"), a siloxane unit represented by $R^{4''}R^{5''}SiO_{2/2}$ (unit D"), and a siloxane unit represented by $R^{6''}SiO_{3/2}$ (unit T"), and at least one unit selected from the group consisting of unit M", unit D", and unit T", and having a functional group (Si—H) content of 5.0 mol/kg or greater (wherein each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom).

2. A laminate comprising
a first substrate formed of a semiconductor-forming substrate,
a second substrate formed of a support substrate, and
an adhesive layer which is provided between the first substrate and the second substrate and which bonds the two substrates in a peelable manner,
wherein the adhesive layer is a cured film formed by use of the adhesive composition as recited in claim 1.

3. A method for producing a laminate, the method comprising:
applying the adhesive composition as recited in claim 1 onto a first substrate formed of a semiconductor-forming substrate or a second substrate formed of a support substrate, to thereby form an adhesive coating layer, and
adhering the first substrate to the second substrate by the mediation of the adhesive coating layer;
applying a load to the first substrate and the second substrate in a thickness direction, to thereby closely bind the first substrate, the adhesive layer, and the second substrate, while at least one of a heat treatment and a reduced pressure treatment is performed; and then
performing a post-heat treatment.

4. A method for thinning a semiconductor-forming substrate, the method comprising:
applying the adhesive composition as recited in claim 1 onto a first substrate formed of a semiconductor-forming substrate or a second substrate formed of a support substrate, to thereby form an adhesive coating layer,
adhering the first substrate to the second substrate by the mediation of the adhesive coating layer;
applying a load to the first substrate and the second substrate in a thickness direction, to thereby closely bind the first substrate, the adhesive layer, and the second substrate, while at least one of a heat treatment and a reduced pressure treatment is performed; and then
performing a post-heat treatment, to thereby form a laminate, and
performing a thinning treatment on the first substrate of the laminate.

* * * * *